United States Patent [19]

Rubin et al.

[11] 4,438,411

[45] Mar. 20, 1984

[54] TEMPERATURE COMPENSATING METHOD AND APPARATUS FOR THERMALLY STABILIZING AMPLIFIER DEVICES

[75] Inventors: Michael D. Rubin, Saratoga; Pang T. Ho, Mountain View, both of Calif.

[73] Assignee: Ford Aerospace & Communications Corporation, Detroit, Mich.

[21] Appl. No.: 284,755

[22] Filed: Jul. 20, 1981

[51] Int. Cl.³ .............................................. H03F 3/04
[52] U.S. Cl. ..................................... 330/289; 330/297
[58] Field of Search ................. 330/289, 297, 256, 260

[56] References Cited

U.S. PATENT DOCUMENTS

| | | | |
|---|---|---|---|
| 4,207,538 | 6/1980 | Goel | 330/289 |
| 4,218,660 | 8/1980 | Carver | 330/263 |

*Primary Examiner*—James B. Mullins
*Assistant Examiner*—G. Wan
*Attorney, Agent, or Firm*—Robert K. Stoddard; Kenneth R. Allen; Edward J. Radlo

[57] ABSTRACT

The amplifier device, which may be an FET power amplifier, is of the type having an operating parameter which exhibits thermal instability under constant electrode bias conditions, and thermal stability when bias is varied as a function of ambient temperature in accordance with an empirically determined relationship.

The method involves the empirical determination of the varying bias conditions needed to cause thermal stability of the operating parameter over the required range of temperatures, and the provision of a temperature-compensating power supply which produces the necessary bias at each temperature in the range.

The temperature-compensating power supply incorporates a bias monitor circuit to produce a control signal which has a nearly constant value so long as bias conditions are in accordance with the empirically determined relationship at every temperature within the range. However, if bias deviates from the predetermined relationship, the control signal also deviates, such that control signal deviations are a monotonic function of bias deviations. The power supply is provided with a feedback-control circuit which responds to the control signal deviations by adjusting the output magnitude of the supply to agree with the predetermined relationship.

10 Claims, 3 Drawing Figures

TEMPERATURE COMPENSATING METHOD AND APPARATUS FOR THERMALLY STABILIZING AMPLIFIER DEVICES

BACKGROUND OF THE INVENTION

This invention relates generally to the field of thermal stabilization of electronic circuits to achieve as constant a performance level as possible despite wide variations of ambient temperature. More particularly, the invention deals with the problem of thermally stabilizing the operating parameters of FET amplifier devices such that widely varying ambient temperatures do not cause appreciable shifts in stage gain, power output, power consumption or other important parameters.

In general, the approaches adopted in the past for dealing with such problems have proceded along two paths: (a) the device or circuit was enclosed within an isothermal envelope such that it no longer encountered varying ambient temperatures, or (b) the inconstant operating parameters were compensated by the inclusion in the circuit of various non-linear elements which had an opposite effect under varying ambient temperatures, and could thus cancel the effect of the shifting operating parameters of the semiconductor devices.

Each of these approaches continues to be used in appropriate circumstances, but each suffers from a number of shortcomings. The maintenance of an isothermal environment around a device or circuit requires extra equipment which is cumbersome, complex and expensive. Moreover, the power consumed by the necessary heating or cooling equipment may represent an intolerable burden in such applications as communications satellites, where available power sources must be strictly conserved.

The use of compensating devices in the concerned circuit is not always an adequate solution to the problem, since the range and characteristics of the available compensating devices may not provide a satisfactory degree of compensation in every instance. Furthermore, the circuit configurations necessary to employ such compensatory devices sometimes entail a limitation on the function of the circuit being compensated.

Description of the Prior Art

The following references were produced during a search of the available prior art:

U.S. Pat. No. 3,388,309 is a voltage-regulated power supply which has been provided with compensation for varying ambient temperature conditions by the inclusion of a temperature-sensitive reference voltage. However, the effect achieved by this means is to render the output of the supply invariant with changing temperature. Such a supply could not provide any compensation for the shifts in operating parameters which occur in many semiconductor devices which undergo variations in ambient temperature.

U.S. Pat. No. 3,562,668 is a supply of the AC-to-DC converter type which references the output voltage against a constant reference voltage and thus achieves a constant output voltage.

U.S. Pat. No. 3,740,539 is a supply of the DC-to-DC converter type which employs a control circuit 18 to regulate the output voltage by controlling the conduction state of transistor Q1. However, the effect is to achieve voltage regulation, or constant output voltage as disclosed at column 2, lines 34–36.

U.S. Pat. No. 3,935,526 is a converter-type power supply of fairly conventional design in which a difference amplifier 10 is used to compare the output voltage with a reference voltage provided by a reference cell 11. The resulting output voltage as controlled by this arrangement is constant.

U.S. Pat. No. 4,020,408 is a DC-to-DC converter supply providing a "constant output voltage" as disclosed at column 6, lines 29–41.

IBM Technical Disclosure Bulletin, vol. 14, no. 11, April, 1972 discloses an optically isolated supply which utilizes a comparator 50 to compare the output voltage with a "stable reference voltage", an arrangement which would result in an equally stable output voltage.

SUMMARY OF THE INVENTION

The principal object of the present invention is the provision of a method and apparatus for temperature-stabilizing the operating parameters of amplifier devices and the electronic circuits in which they are employed.

A second object of the present invention is the provision of a method for thermally stabilizing an operating parameter of an amplifier device by varying the electrode bias supplied to that device as a function of ambient temperature in accordance with a predetermined relationship.

A third object of the present invention is the provision of a temperature-compensating power supply for supplying an amplifier divice with an electrode bias which varies as a function of ambient temperature in accordance with a predetermined relationship.

A fourth object of the present invention is the provision of a power supply which incorporates an ambient-temperature-sensitive feedback control means to vary the output of the supply as a function of ambient temperature in accordance with a predetermined relationship.

To the above ends, the method of temperature-stabilizing the operating parameters of amplifier devices according to the present invention involves empirically determining the electrode bias required to stabilize the thermally sensitive operating parameter at a number of temperatures throughout the operating range, and providing a power supply which produces an output which varies as a function of ambient temperature substantially in accordance with the empirically determined relationship.

Such a power supply can be provided according to the present invention by employing a feedback-controlled DC-to-DC converter having a bias monitor circuit which produces a control signal having a substantially constant value at every temperature so long as the output of the supply conforms to the predetermined relationship. Deviations of the bias output of the supply from the predetermined relationship with ambient temperature cause corresponding deviations of the control signal from the constant value, causing correction of the output.

The above and other features, objects and advantages of the present invention together with the best mode contemplated by the inventors thereof for carrying out their invention will become more apparent from reading the following description of a preferred embodiment of the invention and studying the associated drawing, in which:

BRIEF DESCRIPTION OF THE DRAWING

FIG. 3 is a schematic diagram of a power supply employing the teachings of the present invention.

DESCRIPTION OF A PREFERRED EMBODIMENT

Figure 1:
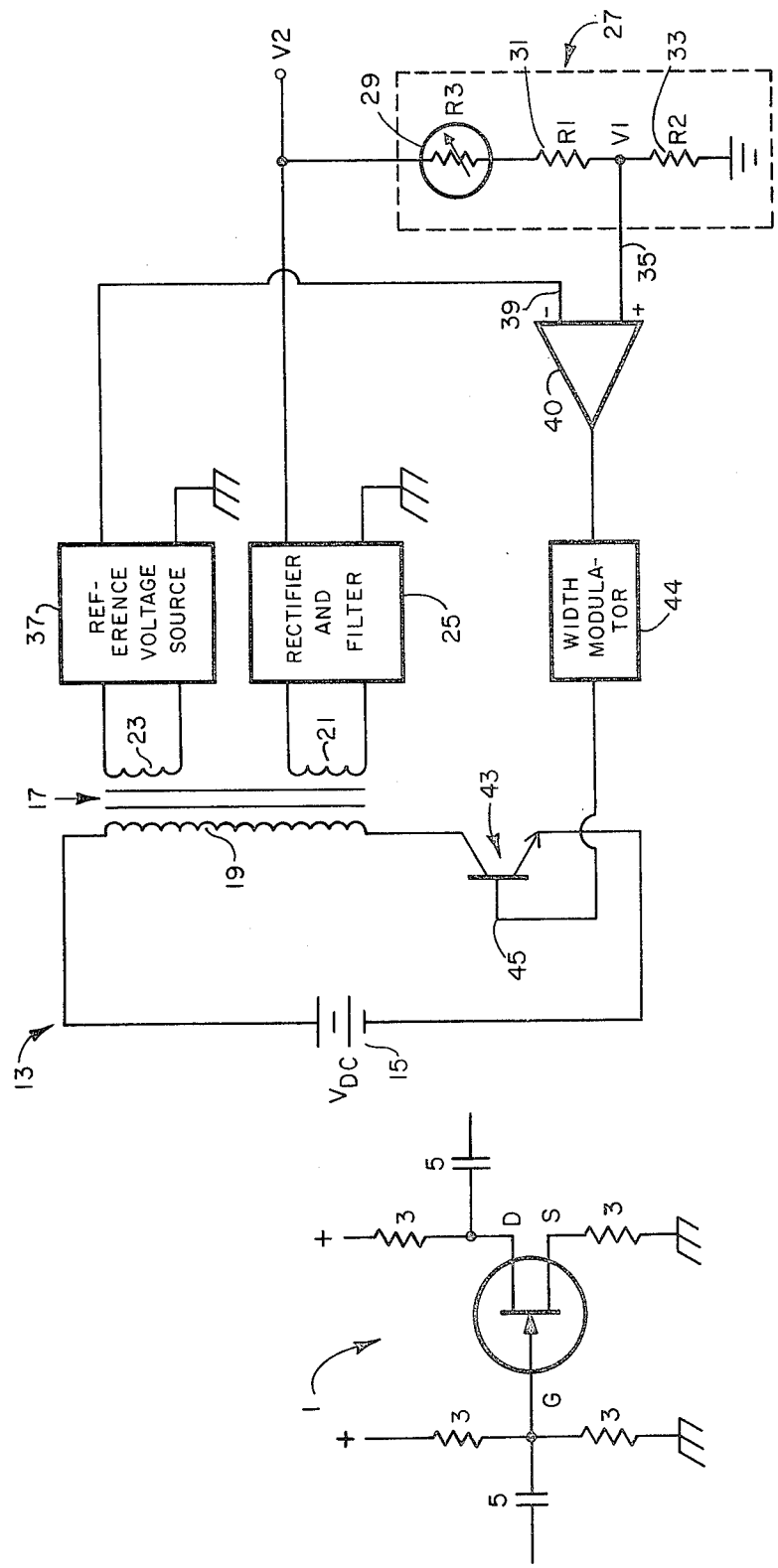
FIG. 1 is a generalized schematic diagram of an amplifier device which may employ the concepts of the present invention for thermal stabilization.

In FIG. 1, an amplifier device 1 of the field-effect transistor (FET) type is illustrated in a generalized circuit in which it might be employed for power amplification, for example. In the circuit configuration shown, the source electrode S, the drain electrode D, and the gate electrode G are shown connected in a resistive network made up of resistors 3 which, together with the power supply voltages indicated generally by + signs, establish the DC operating bias voltages on electrodes G, D, and S. A pair of capacitors 5 are shown connected to the gate and drain electrodes for the purpose of coupling AC signals into and out of the stage, respectively.

Although a practical circuit might differ considerably from the prototypical amplifier circuit illustrated in FIG. 1, and might therefore dispense with one or more of resistors 3, might employ feedback from output to input, or might be a split-phase configuration instead of the single-ended configuration illustrated, all such alternate configurations can be expected to suffer to a greater or lesser degree from a shifting of the operating parameters as a result of ambient temperature changes. If device 1 were a GaAs FET, a fairly considerable change in power output would occur over an ambient temperature range of −5 to +55 degrees Celsius, as will appear later in this specification. Such a shift cannot moreover be avoided by careful design or manufacture of the FET, since it results principally from a decrease in electron mobility in the crystal as ambient temperature rises.

Figure 2:
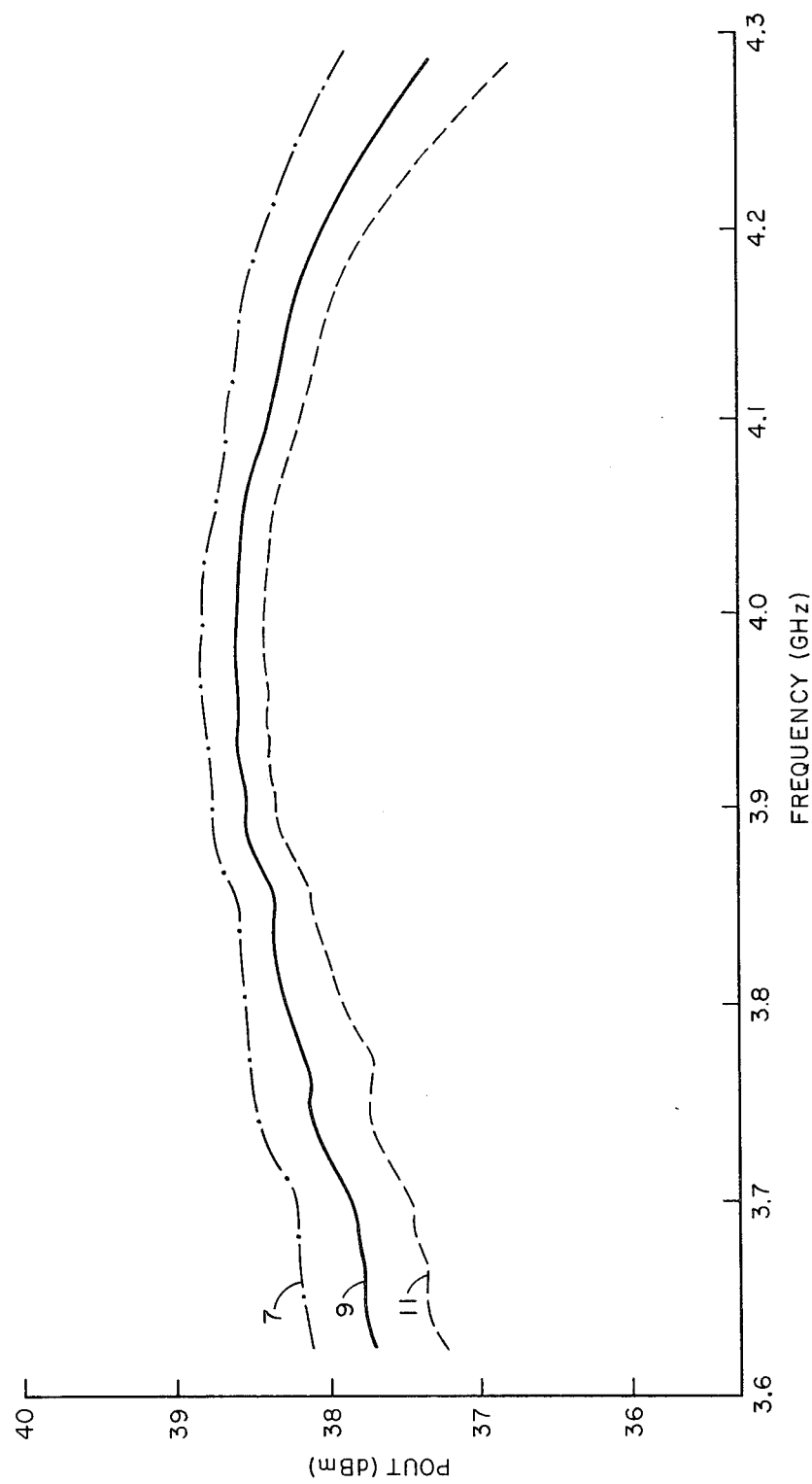
FIG. 2 is a graph illustrating the effect of changing ambient temperature on the power output of a 3-stage FET amplifier.

In FIG. 2, the actual measured performance of a 3-stage RF amplifier employing GaAs FETs is graphically illustrated. FIG. 2 is a plot of RF output power in dBm versus frequency for three different ambient temperatures, utilizing a fixed drain bias. Curve 7 shows the performance of this particular circuit at −5 degrees Celsius, while curves 9 and 11 are illustrative of performance at +25 and +55 degrees Celsius, respectively. Although the frequency bandpass of this particular circuit did not change appreciably with changing ambient temperature, FIG. 2 clearly illustrates a significant decline in power output as temperature rises. Although not shown in FIG. 2, the power consumption of the circuit also showed a similar decline over the temperature range, being 21.58 W at −5 degrees, and only 19.6 W at +55 degrees Celsius.

While the above change in power output over the ambient temperature range might seem modest, the amplifier concerned was intended for use in a satellite communications package which was subject to a fairly strict gain-stability specification over the ambient temperature range. Only a certain portion of the allowable instability could be apportioned to this amplifier stage without requiring unrealistic stability of the other stages of the package.

In applications where power available is strictly limited, as it is in satellite spacecraft for example, a change in power consumption is a significant drawback. The solar array provided must be made larger than would otherwise be needed, merely to provide for the excessive power consumption at low ambient temperatures.

The particular amplifier whose performance is illustrated in FIG. 2 was employed as the RF output stage of the communications satellite, and was operated under substantially saturated large-signal conditions. Furthermore, the small-signal characteristics had been controlled by temperature compensation of the gate bias. Under these circumstances, the available means for thermally compensating large-signal performance seemed to favor the investigation of drain bias compensation. In accordance with the present invention, we have discovered that the poor thermal stability exemplified by FIG. 2 can be significantly improved if an amplifier device is supplied with a varying electrode bias which changes as a function of ambient temperature in accordance with an empirically predetermined relationship. In the case of the 3-stage FET amplifier of FIG. 2, we have empirically determined that substantial thermal stability can be achieved by providing that the drain bias be varied as a function of ambient temperature in accordance with the relationship set out in the following table:

TABLE 1

| Temperature in degrees Celsius | Drain Voltage |
|---|---|
| −10 | 12.30 |
| 0 | 12.59 |
| +10 | 12.88 |
| 20 | 13.16 |
| 25 | 13.30 |
| 30 | 13.45 |
| 40 | 13.73 |
| 50 | 14.02 |
| 60 | 14.30 |

Although these figures can be expected to differ in the case of different amplifier devices and different circuit configurations, in general it will be found that many other amplifier devices which exhibit intrinsic thermal instability can be successfully stabilized by the expedient taught in this specification. That expedient is, of course, to provide a "tailored" electrode bias supply which varies electrode bias as a function of ambient temperature in accordance with a relationship which has been predetermined to substantially cancel the effect of the thermal instability.

Turning now to FIG. 3, a temperature-compensating power supply 13 according to the present invention is shown. Supply 13 is basically of the DC-to-DC converter variety, and employs a DC voltage source 15 which might be a battery of storage cells. DC voltage source 15 is connected in a series circuit with a switching transistor 43 and the primary winding 19 of a transformer 17. Transistor 43 essentially "chops" the DC current flowing in primary winding 19 such that the AC components of the resultant waveform are coupled into a pair of secondary windings 21 and 23.

Winding 21 provides the input to a combined rectifier and filter circuit 25 of conventional type, which changes the AC waveform from secondary winding 21 to a smooth DC output at a voltage V2 for supplying the electrode bias to the amplifier device. In the particular case of the RF amplifier of FIG. 2, V2 is utilized as the drain bias.

Winding 23 provides the AC input to a reference-voltage-generating circuit 37 which is of a conventional type similar to circuit 25 except that it includes a means, such as a Zener diode, for providing a constant DC reference voltage at its output despite changes in the AC input coming from winding 23.

A bias-monitor circuit 27 is connected from the bias output of supply 13 to ground, and consists in this illustrated embodiment of a simple passive series circuit of a thermally dependent resistor 29, and a pair of fixed resistors 31 and 33. Resistors 29, 31 and 33 together form a voltage divider providing a voltage V1 which is a function of the voltage V2 in a well known fashion. However in bias-monitor circuit 27, voltage V1 is not a fixed percentage of V2, as it would be in the case of a fixed voltage divider, because the actual value of resistor 29 is a function of ambient temperature, such that the ratio V1/V2 also depends on ambient temperature.

It can be shown for this simple circuit that by proper selection of the values R3(T) of resistor 29, R1 of resistor 31, and R2 of resistor 33, voltage V1 will have a substantially constant value over the ambient temperature range when V2 varies with ambient temperature in accordance with Table 1. above. That is, by careful selection of the values of R1, R2, and R3(T), V1 will remain constant if and only if V2 is caused to vary with temperature substantially in accordance with Table 1.

Utilizing the relationship provided by the voltage division, $$V1 = R2/(R1 + R2 + R3) \times V2$$

the following values were found by a computer program employing successive approximation:
resistor 29 to be a sensistor having a linear resistance versus temperature characteristic and a resistance at 25 degrees Celsius of 6.8K; resistor 31, a fixed resistor of 3.9K; and resistor 33, a fixed resistor of 10K.

It must be emphasized that the particular bias-monitor circuit 27 illustrated is not the only one that could be employed. In fact, a more perfect degree of compensation can be achieved the more nearly the chosen circuit approximates the empirically determined relationship between electrode bias and ambient temperature. However, the simple circuit 27 chosen achieved a sufficiently accurate approximation of the relationship of Table 1 to meet the design requirments.

Having thus secured a control voltage V1 which has a substantially constant value only when the bias output voltage V2 varies with ambient temperature substantially in accordance with Table 1, the design of the remainder of the supply 13 becomes relatively simple. The reference voltage provided by circuit 37 is also established at the constant value of V1 through selection of the appropriate component values in circuit 37.

A voltage comparator circuit 40 compares V1 at input line 35 with the reference voltage from circuit 37 at input line 39 and generates an error signal which is passed to a width modulator circuit 44. If V1 has the same value as the reference voltage, indicating that V2 has a value in accordance with the empirically determined relationship of Table 1, then the resulting 0 error signal will cause no change in the duty cycle produced by modulator circuit 44. However, if drift of V1 from the constant value is present, an error signal will be generated, causing modulator circuit 44 to produce a change in the duty cycle of switching transistor 43 by means of the connection of the modulator circuit to the base 45 of transistor 43. In this way, the output V2 is held substantially to the voltage relationship stated above in Table 1.

Although this invention has been illustrated by reference to a preferred embodiment which comprises the best mode known to us for carrying out our invention, many changes could be made, and many alternative embodiments thus derived without departing from the scope of the invention. Consequently, the scope of the invention is to be interpreted only from the following claims.

What is claimed is:

1. For use in a power supply to an amplifier device, said amplifier device being operative to exhibit monotonic instability of at least one operating parameter at a constant bias on a large signal electrode with varying temperature and being operative to exhibit stability of said parameter with pre-determined controlled variation of said bias on said large signal electrode as a function of temperature, an apparatus for controlling variation of power supply output, said power supply output for application at said large signal electrode of said amplifier device, said apparatus comprising:

bias monitor circuit means, said bias monitor circuit means being coupled to receive as a sensed input signal a parameter representative of ambient temperature, said bias monitor circuit being operative to convert said ambient temperature sensed input signal into an electric signal representative of a thermal value for use in regulating said power supply output; and feedback signal generating means, said feedback signal generating means being coupled to receive said electric signal for varying said power supply output to follow said pre-determined controlled variation of electrode bias on said large signal electrode as a function of temperature, wherein said feedback signal generating means includes a DC-to-DC converter circuit comprising a DC source, a switching means for chopping said source to form and AC voltage waveform, and rectifier and filter means to convert said AC voltage waveform to a DC output voltage, and wherein said feedback signal generating means further comprises a reference voltage source, a voltage comparator circuit connected to compare said control signal with said reference voltage source and to generate an error signal, a width modulator circuit connected to receive said error signal and, in response to said error signal, to control the pulse width of output signals of said switching means.

2. For use in a power supply to an amplifier device, said amplifier device being operative to exhibit monotonic instability of at least one operating parameter at a constant bias on a large signal electrode with varying temperature and being operative to exhibit stability of said parameter with predetermined controlled variation of said bias on said large signal electrode as a function of temperature, an apparatus for controlling variation of power supply output, said power supply output for application at said large signal electrode of said amplifier device, said apparatus comprising:

bias monitor circuit means, said bias monitor circuit means being coupled to receive as a sensed input signal a parameter representative of ambient temperature, said bias monitor circuit means being operative to convert said ambient temperature sensed input signal into an electric signal representative of a thermal value for use in regulating said power supply output; and feedback signal generating means, said feedback signal generating means being coupled to receive said electric signal for varying said power supply output to follow said predetermined controlled variation of bias on said large signal electrode as a function of temperature;

said bias monitor circuit means and said feedback signal generating means being operative independent of any signal amplified by said amplifier device.

3. The apparatus of claim 2, wherein said bias monitor circuit means comprises a voltage divider including a resistor having a resistance which is a linear function of temperature, and a resistor having a resistance which is thermally invariant.

4. The apparatus according to claim 2 wherein said amplifier device comprises a field effect transistor, and said power supply output is coupled to a drain electrode of said transistor.

5. The apparatus of claim 2, wherein said bias monitor circuit means comprises a network of passive elements.

6. The apparatus of claim 5, wherein said bias monitor circuit means comprises a resistive network.

7. The apparatus of claim 6, wherein said bias monitor circuit means comprises a voltage divider network including at least one temperature-dependent resistor.

8. The apparatus of claim 2, wherein said bias monitor circuit means comprises a voltage divider including a plurality of resistors in series circuit combination, wherein said bias supply produces a voltage between the ends of said series circuit combination, and wherein said electric signal is derived between the ends of at least one of said resistors.

9. The apparatus of claim 8, wherein said voltage divider includes at least one temperature-dependent resistor.

10. A method for stabilizing an operating parameter of an amplifier device over a range of operating temperatures, wherein said amplifier device is operative to exhibit instability of at least one operating parameter at a constant bias on a large signal electrode with varying temperature and being operative to exhibit stability of said parameter with predetermined controlled variation of said bias on said large signal electrode as a function of temperature, said method comprising the steps of:

sensing ambient temperature in said amplifier device and converting said ambient temperature into an electric signal representative of a thermal value for use in regulating variation of said power supply outputs; and varying said power supply output coupled to said large signal electrode to follow said pre-determined controlled variation of bias on said large signal electrode as a function of temperature and independent of any signal amplified by said amplifier device.

* * * * *